US008035219B2

(12) United States Patent
Davis et al.

(10) Patent No.: US 8,035,219 B2
(45) Date of Patent: Oct. 11, 2011

(54) PACKAGING SEMICONDUCTORS AT WAFER LEVEL

(75) Inventors: William J. Davis, Hollis, NH (US);
Ward G. Fillmore, Hudson, MA (US);
Scott MacDonald, Medford, MA (US)

(73) Assignee: Raytheon Company, Waltham, MA (US)

( * ) Notice: Subject to any disclaimer, the term of this patent is extended or adjusted under 35 U.S.C. 154(b) by 307 days.

(21) Appl. No.: 12/175,692

(22) Filed: Jul. 18, 2008

(65) Prior Publication Data
US 2010/0013088 A1    Jan. 21, 2010

(51) Int. Cl.
*H01L 23/12* (2006.01)
*H01L 21/00* (2006.01)

(52) U.S. Cl. ......... 257/701; 257/E21.505; 257/E23.005; 438/107

(58) Field of Classification Search .................. None
See application file for complete search history.

(56) References Cited

U.S. PATENT DOCUMENTS

| 6,175,287 | B1 | 1/2001 | Lampen et al. |
| 2005/0104204 | A1 | 5/2005 | Kawakubo et al. |
| 2006/0220173 | A1 | 10/2006 | Gan et al. |
| 2007/0108579 | A1 | 5/2007 | Bolken et al. |
| 2007/0181979 | A1 | 8/2007 | Beer et al. |
| 2008/0064142 | A1 | 3/2008 | Gan et al. |
| 2010/0224987 | A1* | 9/2010 | Hochstenbach ............... 257/693 |

FOREIGN PATENT DOCUMENTS

| EP | 0 810 659 A2 | 12/1997 |
| EP | 0 810 659 A3 | 12/1997 |
| FR | 2 780 200 | 12/1999 |

OTHER PUBLICATIONS

Notification of Transmittal of the International Search Report dated Oct. 5, 2009, PCT/US2009/048079.
The International Search Report dated Oct. 5, 2009, PCT/US2009/048079.
Written Opinion of the International Searching Authority dated Oct. 5, 2009, PCT/US2009/048079.
Response to Final Rejection mailed Aug. 30, 2010 for co-pending U.S. Appl. No. 11/762,924, filed Jun. 14, 2007.
Notification Concerning Transmittal of International Preliminary Report on Patentability (Chapter 1 of the Patent Cooperation Treaty), PCT/US2009/048079, date of mailing Jan. 27, 2011, 2 pages.
Written Opinion of the International Searching Authority, PCT/US2009/048079, date of mailing Jan. 27, 2011, 5 pages.

* cited by examiner

*Primary Examiner* — Alonzo Chambliss
(74) *Attorney, Agent, or Firm* — Daly, Crowley, Mofford & Durkee, LLP

(57) ABSTRACT

A method for packaging a plurality of semiconductor devices formed in a surface portion of a semiconductor wafer. The method includes: lithographically forming, in a first lithographically processable material disposed on the surface portion of the semiconductor wafer, device exposing openings to expose the devices and electrical contact pad openings to expose electrical contact pads for devices; and mounting a support having a rigid dielectric layer formed on a selected portion of the support, such rigid dielectric layer comprising a second lithographically processable material, such rigid material being suspended over the device exposing openings and removed from portions of the support disposed over the electrical contacts pads openings in the first lithographically processable material. The support is released and removed from the second lithographically processable material, leaving the second photolithographically processable material bonded to the first photolithographically processable material.

5 Claims, 4 Drawing Sheets

PACKAGING SEMICONDUCTORS AT WAFER LEVEL

TECHNICAL FIELD

This invention relates generally to methods for packaging (i.e., encapsulating) semiconductors and more particularly to methods for packaging semiconductors at a wafer level (i.e., wafer-level packaging).

BACKGROUND AND SUMMARY

As is known in the art, traditionally in the microelectronics industry, electrical devices are fabricated on wafers and then diced into individual chips. The bare chips would then get assembled with other components into a package for environmental and mechanical protection. In commercial applications, the chips were generally assembled into plastic packages. In military applications, where electronics are generally exposed to harsher environments, the parts are generally housed in a hermetic module. Such packages or modules would then be further assembled unto circuit boards and systems. However, as electronic systems advance, there is a need to increase functionality while decreasing the size and cost of components and sub-systems.

One way to reduce size and cost is to create packages at the wafer level and then subsequently dicing the wafer into individual packaged semiconductors (i.e., wafer-level packaging). Many methods have been suggested to create wafer-level packages. One method, call wafer bonding, is to bond a wafer with pre-formed cavities over the device wafer. The bonding can be achieved through thermal bonding, adhesive or solder bonding, see for example, Rainer Pelzer, Herwig Kirchberger, Paul Kettner, "Wafer-to Wafer Bonding Techniques: From MEMS Packaging to IC Integration Applications", 6th IEEE International Conference on Electronic Packaging Technology 2005 and A. Jourdain, P. De Moor, S. Pamidighantam, H. A. C. Tilmans, "Investigation of the Hermeticity of BCB-Sealed Cavities For Housing RF-MEMS Devices", IEEE Electronic Article, 2002

However, this method introduces a lot of complexity and issues into the process. Thermal bonding is generally achieved at very high temperatures, in excess of 400 C. Adhesive bonding can be achieved at lower temperature, but adhesive outgassing is a concern. Therefore wafer bonding is not a suitable and cost-effective method for some applications.

Another approach is to use Liquid crystal polymer (LCP). It has recently become a popular candidate for various packaging approaches, due to its excellent electrical, mechanical and environmental properties. The material comes in rolls and can be laminated unto the wafer as a film. A general method is to use multiple stacks of LCP. Individual holes were created in a layer of LCP and laminated over the wafer so that the device or FETs are exposed through the holes. This first layer of LCP forms the sidewall of the cavity. Then a second layer of LCP is laminated over the entire wafer, thus enclosing the cavity, see Dane. C. Thompson, Manos M. Tentzeris, John Papapolymerou, "Packaging of MMICs in Multilayer of LCP Substrates," *IEEE Microwave and Wireless Components Letters*, vol. 16, No. 7, July 2006. Single stack of LCP can also be used, but cavities still must be formed on the material before lamination unto wafer, see Dane. C. Thompson, Nickolas Kinglsley, Guoan Wang, John Papapolymerou, Manos M. Tentzeris, "RF Characteristics of Thin Film Liquid Crystal Polymer (LCP) Packages for RF MEMS and MMIC Integration", *Microwave Symposium Digest,* 2005 *IEEE MTT-S International,* 12-17 Jun. 2005 Page(s): 4 pp. and Mogan Jikang Chen, Anh-Vu H. Pham, Nicole Andrea Evers, Chris Kapusta, Joseph Iannotti, William Kornrumpf, John J. Maciel, Nafiz Karabudak, "Design and Development of a Package Using LCP for RF/Microwave MEMS Switches", *IEEE Transactions on Microwave Theory and Techniques,* vol. 54, No. 11, November 2006. The prior work mentioned above involve forming a pattern on the cavity material first and then bonded to the device wafer. There are several disadvantages: First, this is a complicated and cumbersome process. One must ensure very accurate alignment in pattern formation and wafer bond; second, the cavities are generally large that covers the entire chip due to the alignment difficulty. There is not much flexibility in creating cavities that covers just the active devices and individual passive components. Generally, with a larger cavity, not only that the risk for mechanical failure is greater, environmental protection of the package is also compromised, see Aaron Dermarderosian, "Behavior of Moisture in Sealed Electronic Enclosures," International IMAPS conference in San Diego, October of 2006. These issues with traditional methods limit the manufacturability and performance of the package.

Besides reducing size and cost, a wafer-level package also needs to offer the same level of environmental protection as the traditional packages. They are generally required to pass the leak detection test under Method 1014, MIL-STD-883 and the humidity testing under JEDEC Standard No. 22-A101-B. One way to protect the devices is through the application of hermetic coatings, see M. D. Groner, S. M. George, R. S. McLean and P. F. Carcia, "Gas diffusion barriers on polymers using Al2O3 atomic layer deposition," *Applied Physics Letters,* 88, 051907 (2006), but direct application of the coating unto certain semiconductor devices can degrade performance.

Another way is to make the package itself hermetic. Wafer bonding methods that fuse silicon or glass together generally can achieve hermetic performance. Plastic packages such as LCP and BCB while capable of passing initial hermeticity tests as defined by MIL-Std 883 Method 1014, are described as near-hermetic due to the diffusion rates through these materials compared to glass and metals, see A. Jourdain, P. De Moor, S. Pamidighantam, H. A. C. Tilmans, "Investigation of the Hermeticity of BCB-Sealed Cavities For Housing RF-MEMS Devices", IEEE Electronic Article, 2002 and Dane. C. Thompson, Nickolas Kinglsley, Guoan Wang, John Papapolymerou, Manos M. Tentzeris, "RF Characteristics of Thin Film Liquid Crystal Polymer (LCP) Packages for RF MEMS and MMIC Integration", *Microwave Symposium Digest,* 2005 *IEEE MTT-S International,* 12-17 Jun. 2005 Page(s): 4 pp In multichip-module packaging approaches, the chips are packaged by spinning or laminating the dielectric film over the entire chip. Prior work have been done using various combination of Kapton E, BCB, SPIE, etc., seeVikram B. Krishnamurthy, H. S. Cole, T. Sitnik-Nieters, "Use of BCB in High Frequency MCM Interconnects", *IEEE Transactions on Components, Packaging, and Manufacturing Technology—* Part B, vol. 19, No. 1, February 1996. Although this reduces the processing complexity but performance is degraded because there is no air cavity over the active devices. A dielectric film deposited directly on top of transistors generally degrades its performance due to the increased parasitic capacitance. The multichip-module packaging is a chip-level rather than a wafer-level approach.

In another wafer-level packaging approach, caps made from different material, such as LCP, glass, etc. were dropped unto the wafer to cover individual chips. The caps were sealed in place using adhesives. Again, this is a complex process that picks and places the caps on individual chips; see George Riley, "Wafer Level Hermetic Cavity Packaging", http://www.flipchips.com/tutorial43.html.

In accordance with the present invention, a method is provided for packaging a plurality of semiconductor devices formed in a surface portion of a semiconductor wafer. The method includes: lithographically forming in a first lithographically processable material disposed on the surface portion, device-exposing openings to expose the devices and electrical contacts pads openings; mounting a support having a rigid dielctric layer of a second lithographically processable material on a selected portion of the support, such rigid material being suspended over the device exposing openings (i.e., cavities) and removed from electrical contacts pads openings in the material.

In one embodiment, the first lithographically processable material and the second lithographically processable material comprise the same type of material.

In one embodiment, the first lithographically processable material and the first lithographically processable material comprise BCB.

In one embodiment, the forming a rigid dielectric layer comprises: depositing the second lithographically processable material on a support; lithographically processing the second material to provide a wanted region of the second lithographically processable material on the support with unwanted portions of the second lithographically processable material being removed from the support; mounting the wanted region of the second lithographically processable material on the support over the device exposing openings and the regions having removed therefrom the unwanted portions over the device exposing openings; bonding the wanted region of the second lithographically processable material to the first lithographically processable material; and removing the support while leaving the second lithographically processable material bonded to the first lithographically processable material.

With such method, a fully imaging (or patterning) process of the rigid dielectric layer is performed before application to first lithographically processable material.

In accordance with another feature of the invention, a package for a semiconductor device formed in a surface portion of a semiconductor wafer is provided. The package includes a first lithographically processable, etchable material disposed on the surface portion of the semiconductor wafer having openings therein to expose the device and to expose electrical contacts pads openings; a support; and a rigid dielectric layer of a second lithographically processable, etchable material disposed on a selected region of the support and absent from other regions of the support, such rigid dielectric layer of a second lithographically processable, etchable material being bonded to the first lithographically processable, etchable material, such rigid material being suspended over the device exposing opening and said other regions of the support being disposed over the electrical contacts pads openings in the first lithographically processable, etchable material.

The method described herein has been developed to open cavities in the BCB coating which do not impact the performance of the FET. When assembled at the board level, coatings or under fill are applied to the III-V MMIC device that once again impact device performance, filling the open cavities degrading the performance. Capping, lidding, or covering of the air pocket created in the BCB is now required to protect the device FET from the applied coatings, maintaining the air dielectric constant of 1. This minimizes the impact of the applied coating to the performance of the device. The required height of the air gap created in the cavity will be topology and operating frequency dependant.

Although whole die capping is becoming common in the industry the method for covering the FET air cavity only, allowing for easy direct or wire bond connection to open I/O's is novel to the best of our knowledge.

The method of easy alignment and removal of carrier wafers is also considered novel processing.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
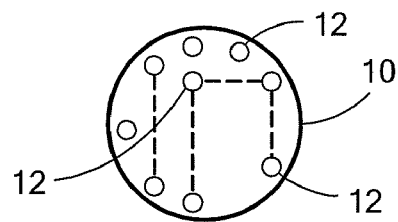
FIGS. 1 through 13 show a semiconductor wafer having devices therein packaged in accordance with the invention at various steps in such packaging.
Figure 2:
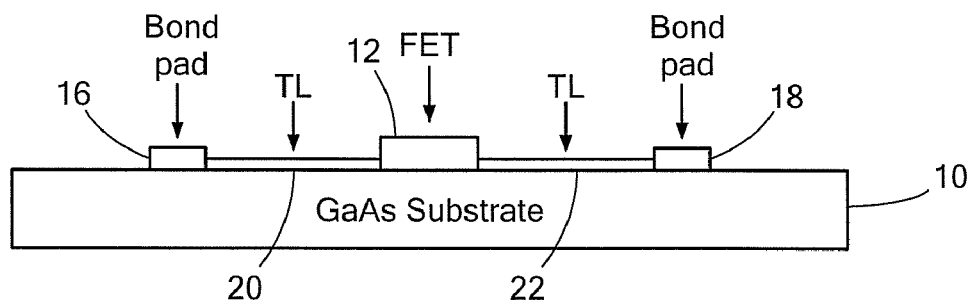
Figure 3:
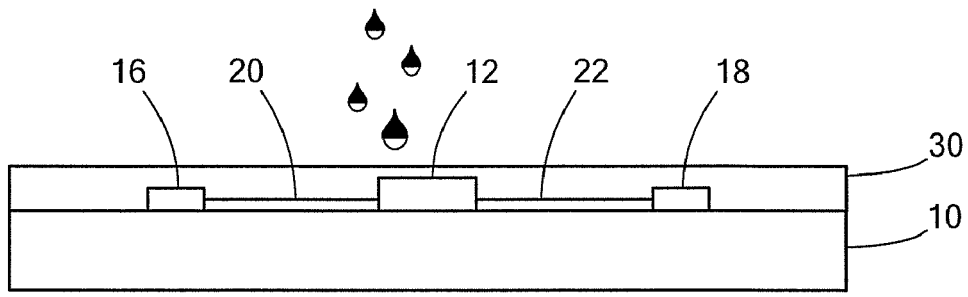

Referring now to FIG. 1, a semiconductor wafer 10 is shown having a plurality of semiconductor devices 12 formed in a surface portion thereof, here the upper surface portion thereof, is shown. An exemplary one of the devices 12 is shown in FIG. 2. Thus, here the wafer is for example, a GaAs or SiC wafer 10, and the devices are, for example, field effect transistors (FETs) each one being connected to bond pads 16, 18 through transmission lines 20, 22 respectively, as shown, Next, a lithographically processable, etchable material 30 is deposited over the upper surface portion of the semiconductor wafer 10, as shown in FIG. 3. Here, for example, lithographically processable, etchable material 30 can be an organic or inorganic material, that can be easily patterned on a wafer using conventional lithographic and etch process to form the sidewall of a cavity to be described. In one embodiment, Benzocyclobutane (BCB) is used being a dielectric material with excellent electrical properties. It has been used in many applications for dielectric coating, 3D interconnect and packaging, see for example, Kenjiro Nishikawa, Suehiro Sugitani, Koh Inoue, Kenji Kamogawa, Tsuneo Tokumitsu, Ichihiko Toyoda, Masayoshi Tanaka, "A Compact V-Band 3-D MMIC Single-Chip Down-Converter Using Photosensitive BCB Dielectric Film", *IEEE Transactions on Microwave Theory and Techniques*, vol. 47, No. 12, December 1999, and Rainer Pelzer, Viorel Dragoi, Bart Swinnen, Philippe Soussan, Thorsten Matthias, "Wafer-Scale BCB Resist-Processing Technologies for High Density Integration and Electronic Packaging", 2005 International Symposium on Electronics Materials and Packaging, December 11-14.

The BCB material 30 can be dispensed as a liquid, spun on, exposed, developed and cured, all using conventional semiconductor fabrication equipment. Because BCB can be patterned by conventional photolithographic technique, it can achieve alignment tolerances and critical dimensions similar to that of photoresist (limited by film thickness). A spin-on process is preferable to a lamination process (such as that for LCP) from a mechanical and process simplicity standpoint. The spin-on process introduces less stress to the wafer, especially for the mechanical fragile structures such as air bridges and is more capable of self leveling over complex circuit topologies.

Figure 4:
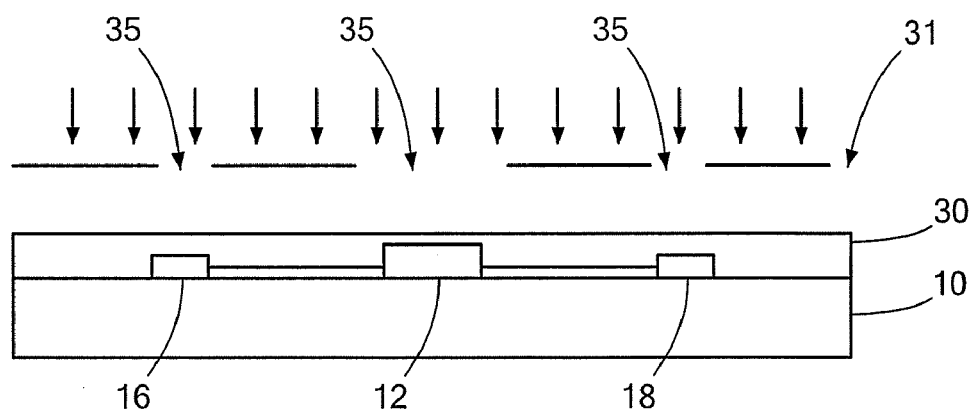
Figure 5:
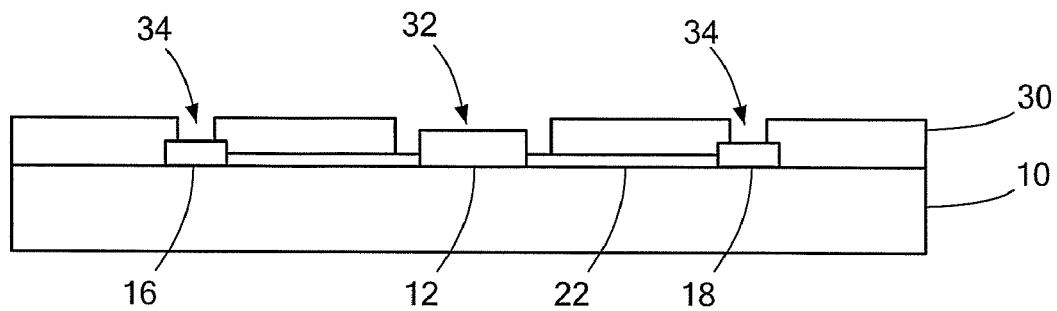

Next, the material 30 is photolithographically processed, as shown in FIG. 4, using a mask 31 having windows 35 disposed over the devices 12 and contact pads 16, 18. After exposed portions of the BCB material 30 are developed away, device openings 32 therein to expose the devices 12 and electrical contacts pads openings 34 therein to expose electrical contact pads 16, 18 as shown in FIG. 5.

After patterns are formed on the BCB material 30, the openings or cavities 32, 34 are enclosed using a mechanically strong, i.e., rigid self-supporting layer 40 that has good adhesion to BCB material 30. More particularly, a rigid dielectric layer 40 of a second lithographically processable material 40 is provided over the formed first lithographically processable material, such rigid material 40 being suspended over the device exposing openings 32, 24 (i.e., cavities) in the material 30.

Here, the first lithographically processable material 30 and the second lithographically processable material 40 comprise the same type of material. In this embodiment, the first lithographically processable material 30 and the second lithographically processable material 40 comprise BCB, here for example having thicknesses of about 17 micrometers.

Figure 6:
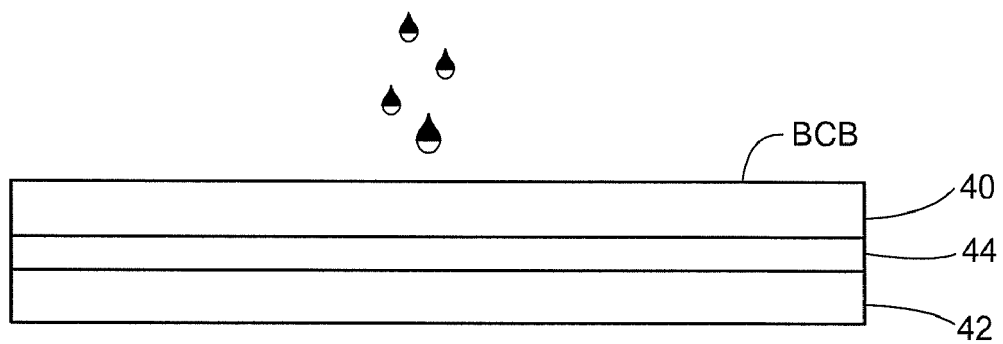

More particularly, the formation of the rigid self-supporting layer 40 begins by, as shown in FIG. 6, providing a support or substrate 42, here for example transparent quartz or thin silicon or other flexible substrate, having disposed on an upper surface thereof a coating or release layer 44, here of a conventional lift off material (here, for example, LOL 1000 lift off material manufactured by Shipley, Marlborough, Mass.) and the layer 40 of layer the second lithographically processable material 40 on the release layer 44, here spun on the release layer 44, as shown.

Figure 7:
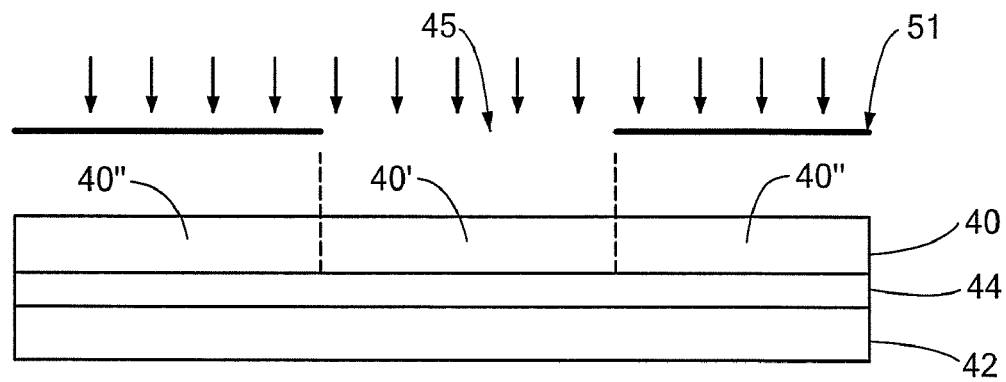
Figure 8:
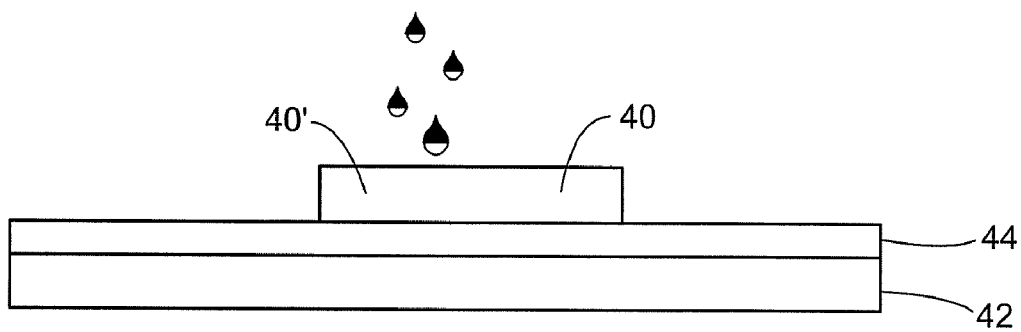

Next, referring to FIG. 7, the second lithographically processable material i.e., layer 40, is photolithographically processed by exposing selected unmasked region 40' of the second lithographically processable material 40 to UV radiation as indicated passing through openings 45 in a photo mask 51, as shown. Thus, after immersing the structure in a developer solution as shown in FIG. 8, the unexposed portions 40" of the second photolithographically processable material 40 are removed from the support 42. Thus, the second lithographically processable material 40 is provided with a wanted region 40' thereof remaining on the support 42 and with the unwanted portions 40" of the second photolithographically processable material 40 being removed from the support 42. Thus, as shown in FIG. 8, the wanted region 40' is an island on the layer 44 and support 42.

Figure 9:
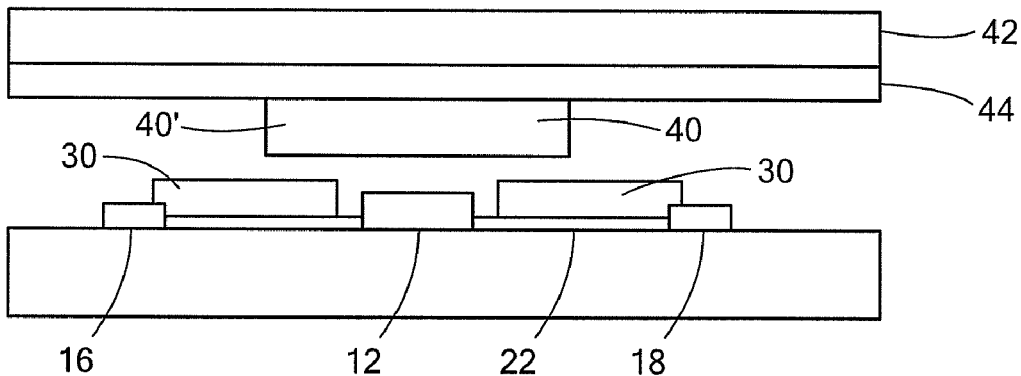
Figure 10:
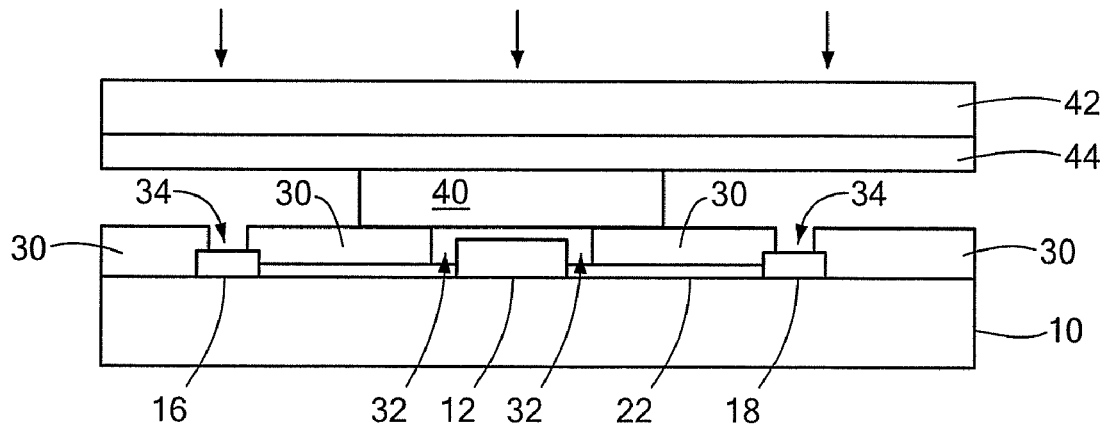
Figure 11:
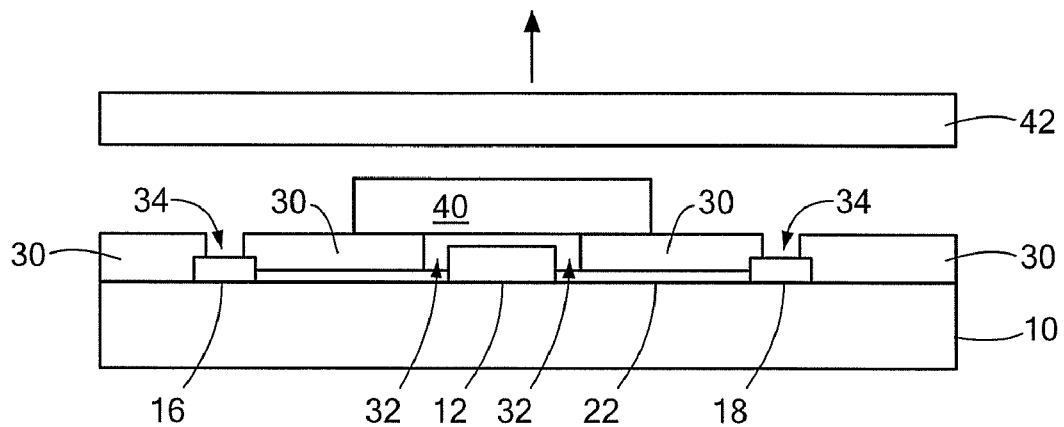

Next, referring to FIG. 9, the second photolithographically processable material on the support 42 is flipped and aligned, utilizing conventional contact alignment tool such as, for example, EVG-620 aligner/bonder utilizing IR or visual alignment dependant upon transparent quartz or thin silicon or other flexible substrate, with the structure shown in FIG. 5, as indicated in FIG. 9. Thus, the wanted regions 40 of the second photolithographically processable material on the support are mounted over the device exposing openings 32 and then heat and pressure (indicated by arrows in FIG. 10) are applied to bond the wanted region of the second photolithographically processable material 40 to the first photolithographically processable material 30, as indicated in FIG. 10. Next, as indicated by the arrow in FIG. 11, the support 42 is released and removed from the second lithographically processable material 40, here for example AZ400K developer manufactured by Clariant, Somerville, N.J. leaving the second photolithographically processable material 40 bonded to the first photolithographically processable material 30.

Then the process continues in any conventional manner, for example, by thinning the backside of the wafer and dicing the devices into individual; now packaged chips.

Figure 12:
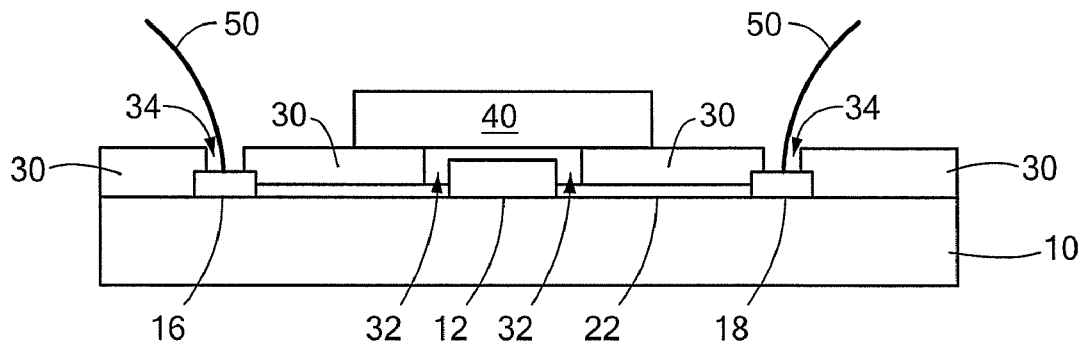
Figure 13:
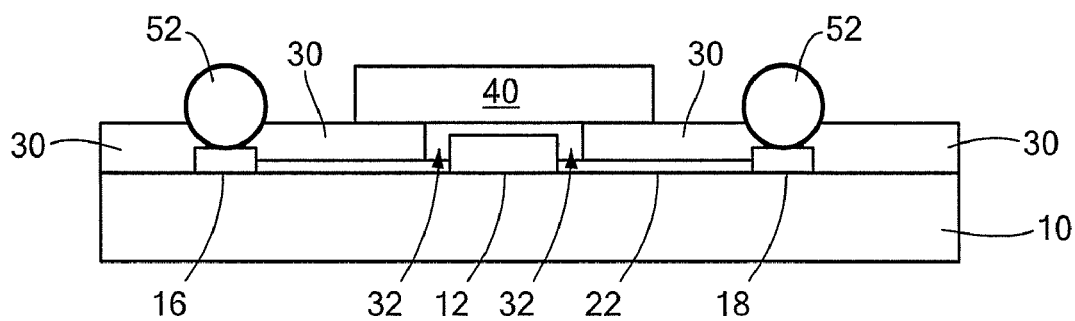

Next, the protected device 12 is ready for wire bonds 50 and final assembly as shown in FIG. 12. Or, the structure shown in FIG. 12 is provided with solder balls 52 as indicated in FIG. 13 for flipped assembly.

A number of embodiments of the invention have been described. For example, materials other than BCB may be used such as SU_8. Nevertheless, it will be understood that various modifications may be made without departing from the spirit and scope of the invention. Accordingly, other embodiments are within the scope of the following claims.

What is claimed is:

1. A package for a semiconductor device for a plurality of spaced transistors formed in a surface portion of a semiconductor wafer, comprising:
   a first lithographically processable, etchable material disposed on and in contact with the surface portion of the semiconductor wafer having a plurality of openings in the first lithographically processable, etchable material, each one a first portion of the openings exposing a corresponding single one of the plurality of spaced transistors and each one of a second portion of the openings in the first lithographically processable, etchable material exposing electrical contacts pads for the transistors; and
   a support;
   a rigid dielectric layer comprising a second lithographically processable material disposed on a selected region of the support and absent from other regions of the support, the second lithographically processable material being suspended over openings in the first lithographically processable, etchable material to expose the devices; and
   wherein said other regions of the support are disposed over the opening to expose the electrical contacts pads.

2. The package recited claim 1, wherein the first lithographically processable, etchable material is BCB.

3. The package recited claim 2, wherein the second lithographically processable, etchable material is BCB.

4. The package recited claim 1, wherein the second lithographically processable, etchable material is BCB.

5. A package for a plurality of spaced transistors formed in a portion of a surface of a semiconductor wafer, comprising:
   electrical contact pads disposed on the wafer;
   transmission lines disposed on the wafer for electrically interconnecting the contact pads to the transistors;
   a first lithographically processable, etchable material disposed on and in contact with the surface of the semiconductor wafer having: a plurality of first openings and a plurality of second openings in the lithographically processable, etchable material, each one of first openings exposing a corresponding single one of the plurality of spaced transistors, and a first portion of the transmission line, each one of the second openings in the lithographically processable, etchable material exposing an electrical contact pad for the transistors; and
   wherein portions of the lithographically processable, etchable material are disposed on second portions of the transmission lines, said second potion of the transmission line being disposed between the electrical contact and the first portion of the transmission line;
   a support;
   a rigid dielectric layer comprising a second lithographically processable material disposed on a selected region of the support and absent from other regions of the support, the second lithographically processable material being suspended over openings in the first lithographically processable, etchable material to expose the devices; and
   wherein said other regions of the support are disposed over the opening to expose the electrical contacts pads.

* * * * *